United States Patent [19]
Kotani

[11] Patent Number: 5,315,180
[45] Date of Patent: May 24, 1994

[54] SYNCHRONIZING INTERFACE CIRCUIT BETWEEN SEMICONDUCTOR ELEMENT CIRCUIT AND A JOSEPHSON JUNCTION ELEMENT CIRCUIT

[75] Inventor: Seigo Kotani, Kawasaki, Japan
[73] Assignee: Fujitsu Limited, Kawasaki, Japan
[21] Appl. No.: 15,842
[22] Filed: Feb. 10, 1993
[30] Foreign Application Priority Data
  Feb. 13, 1992 [JP] Japan .................................. 4-26949
  Feb. 21, 1992 [JP] Japan .................................. 4-34825
[51] Int. Cl.⁵ .................... H03K 19/00; H03K 19/195
[52] U.S. Cl. .................... 307/480; 307/476; 307/269; 307/277; 307/306
[58] Field of Search .............. 307/476, 269, 541, 306, 307/277, 480

[56] References Cited
U.S. PATENT DOCUMENTS
3,904,889  9/1975  Hamel ................................ 307/277
4,974,205  11/1990 Kotani ................................ 307/306
5,126,598  6/1992  Kotani ................................ 307/462
5,233,242  8/1993  Murphy et al. .................... 307/476

FOREIGN PATENT DOCUMENTS
59-190722 10/1984 Japan .

Primary Examiner—Edward P. Westin
Assistant Examiner—Richard Roseen
Attorney, Agent, or Firm—Nikaido, Marmelstein, Murray & Oram

[57] ABSTRACT

In an interface circuit transferring a data signal from a semiconductor element circuit to a Josephson junction element circuit, a first unit detects a change switching of a first clock signal supplied from the semiconductor element circuit, and generates a second clock signal in response to the change of a first clock signal. A second unit performs an AND operation on the data signal and the second clock signal, and outputs the result of the AND operation to the Josephson junction element circuit as a second data signal.

23 Claims, 16 Drawing Sheets

SYNCHRONIZING INTERFACE CIRCUIT BETWEEN SEMICONDUCTOR ELEMENT CIRCUIT AND A JOSEPHSON JUNCTION ELEMENT CIRCUIT

BACKGROUND OF THE INVENTION

1. Field of the Invention

The present invention generally relates to an interface circuit between a semiconductor element circuit and a Josephson junction element circuit, and more particularly an interface circuit for correctly transferring a signal from a semiconductor element circuit including semiconductor elements to a Josephson junction element circuit including Josephson junction elements.

2. Description of the Prior Art

Josephson junction elements operate at high speed and consume little power. Hence, a high-speed processor can be made using Josephson junction elements. Conventionally, in the experiments for testing the operation of a Josephson junction element circuit, a signal pattern for testing the Josephson junction element circuit is generated by a signal generator formed with a semiconductor circuit and is applied thereto.

A Josephson junction logic gate is biased by an alternating current signal for a latching operation, and is reset every clock. A semiconductor logic gate including transistors made of, for example, silicon, is biased by a direct current signal, and is not reset every clock. Further, Josephson elements are required to be operated in synchronism with a clock signal having a frequency higher than that of a clock signal with which semiconductor elements are synchronized. Hence, if a signal from the semiconductor element circuit is directly applied to the Josephson junction element circuit, identical data from the semiconductor element will be received by the Josephson junction element circuit many times within the same cycle of the clock signal for the semiconductor element circuit. Hence, the Josephson junction element circuit malfunctions.

With the above in mind, an interface circuit has been proposed in which a single Josephson junction element is included. When the level of a signal from the semiconductor element circuit exceeds a threshold level, the resistance of the Josephson junction element changes from zero ohms to a certain value. However, the above conventional interface circuit needs to establish synchronization between the semiconductor circuit and the Josephson circuit. That is, the operation of the Josephson circuit must be synchronized with the operation of the semiconductor circuit. The circuit arrangement for establishing the synchronization is very complex, and degrades the high performance of Josephson junction elements.

SUMMARY OF THE INVENTION

It is a general object of the present invention to provide an interface circuit between a semiconductor element circuit and a Josephson junction element circuit in which the above disadvantages are eliminated.

A more specific object of the present invention is to provide an interface circuit capable of asynchronously transferring a signal from a semiconductor element circuit to a Josephson junction element circuit.

The above objects of the present invention are achieved by an interface circuit transferring a data signal from a semiconductor element circuit to a Josephson junction element circuit, the interface circuit comprising: first means for detecting a change of a first clock signal supplied from the semiconductor element circuit and for generating a second clock signal responsive to the change of a first clock signal; and second means, coupled to the first means, for performing an AND operation on the data signal and the second clock signal and for outputting the result of the AND operation to the Josephson junction element circuit as a second data signal.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a first embodiment of the present invention with reference to FIG. 1. An interface circuit 10 is connected between a semiconductor element circuit and a Josephson junction element circuit. The interface circuit 10 functions to correctly transfer a signal from the semiconductor element circuit to the Josephson circuit. In order to transfer signals from the semiconductor element circuit to the Josephson junction element circuit at high speed, the interface circuit 10 includes Josephson junction elements, and does not include semiconductor elements.

Figure 1:
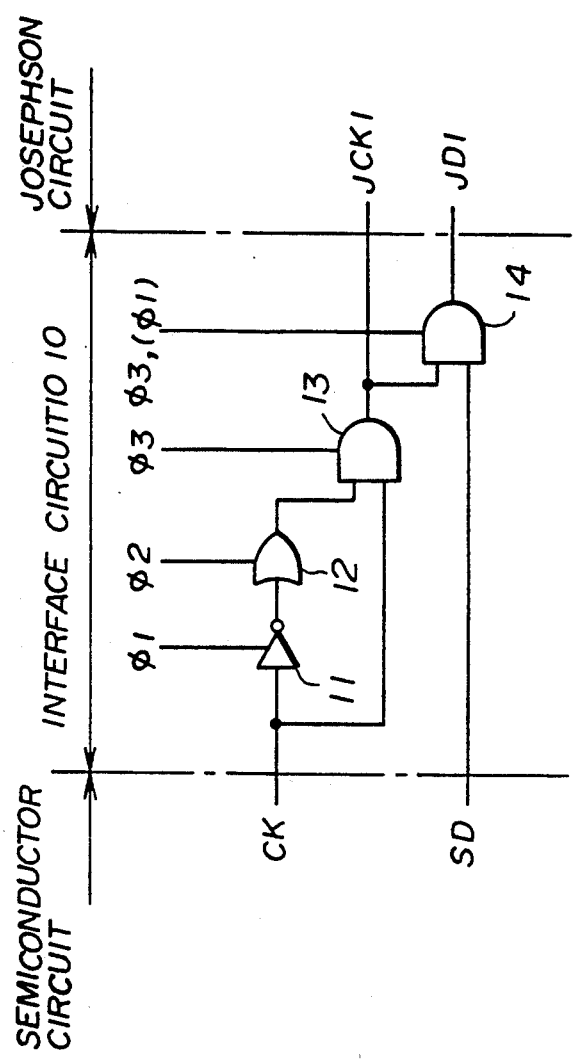
FIG. 1 is a block diagram of an interface circuit according to a first embodiment of the present invention.

The interface circuit 10 shown in FIG. 1 includes an inverter 11, a non-inverting gate 12, and two two-input AND gates 13 and 14. The output terminal of the inverter 11 is connected to the input terminal of the non-inverting gate 12. The output terminal of the non-inverting gate 12 is connected to one of the two input terminals of the AND gate 13. The other input terminal of the AND gate 13 is connected to the input terminal of the inverter 11. The output terminal of the AND gate 13 is connected to one of the two input terminals of the AND gate 14. A clock signal CK having a given duty ratio of, for example, 50%, is applied to the input terminal of the inverter 11 from the semiconductor circuit. Data SD from the semiconductor circuit is applied to the other input terminal of the AND gate 14. Data SD is a non-return-to-zero (NRZ) signal with the rising edge of the clock signal CK.

Figure 3:
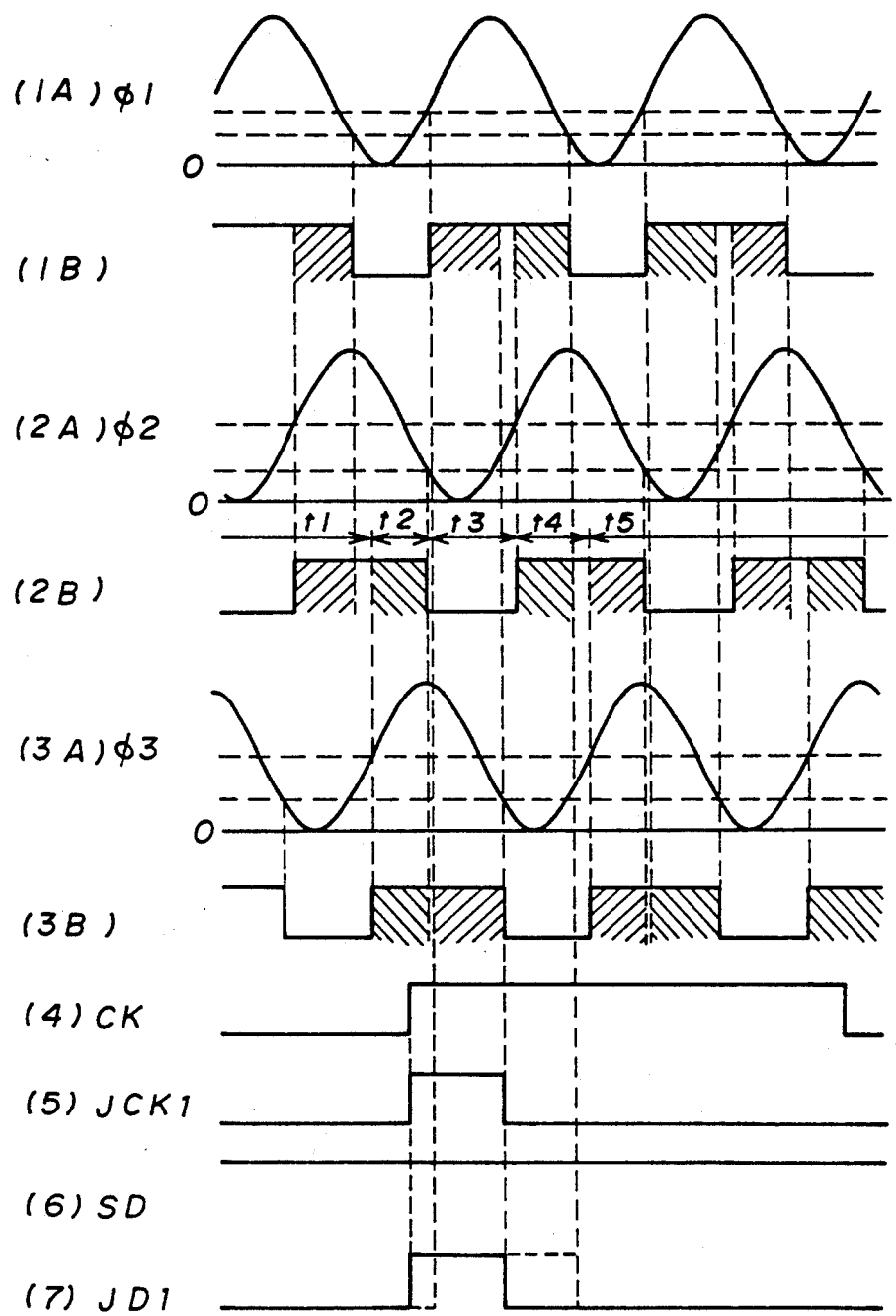
FIG. 3 is a waveform diagram illustrating the operation of the interface circuit shown in FIG. 1.

A clock signal JCK1 is output from the output terminal of the AND gate 13, and is applied to the Josephson circuit. Data JD1 is output from the AND gate 14, and is applied to the Josephson circuit. The clock signal JCK1 defines the timing at which the Josephson circuit reads the data JD1. Alternating bias currents $\phi 1$, $\phi 2$ and $\phi 3$ with offsets (offset voltages) added thereto, as shown in (1A), (2A) and (3A) of FIG. 3, are applied to power supply input terminals of the inverter 11, the non-inverting gate 12 and the AND gate 13, respectively. The phase difference between the alternating bias currents $\phi 1$ and $\phi 2$ is equal to 120°, and the phase difference between the alternating bias currents $\phi 2$ and $\phi 3$ is equal to 120°. Either the bias current $\phi 3$ or $\phi 1$ is applied to the power supply input terminal of the AND gate 14. The alternating bias currents $\phi 1$, $\phi 2$ and $\phi 3$ with offsets added thereto are also used in the Josephson circuit.

Figure 2:
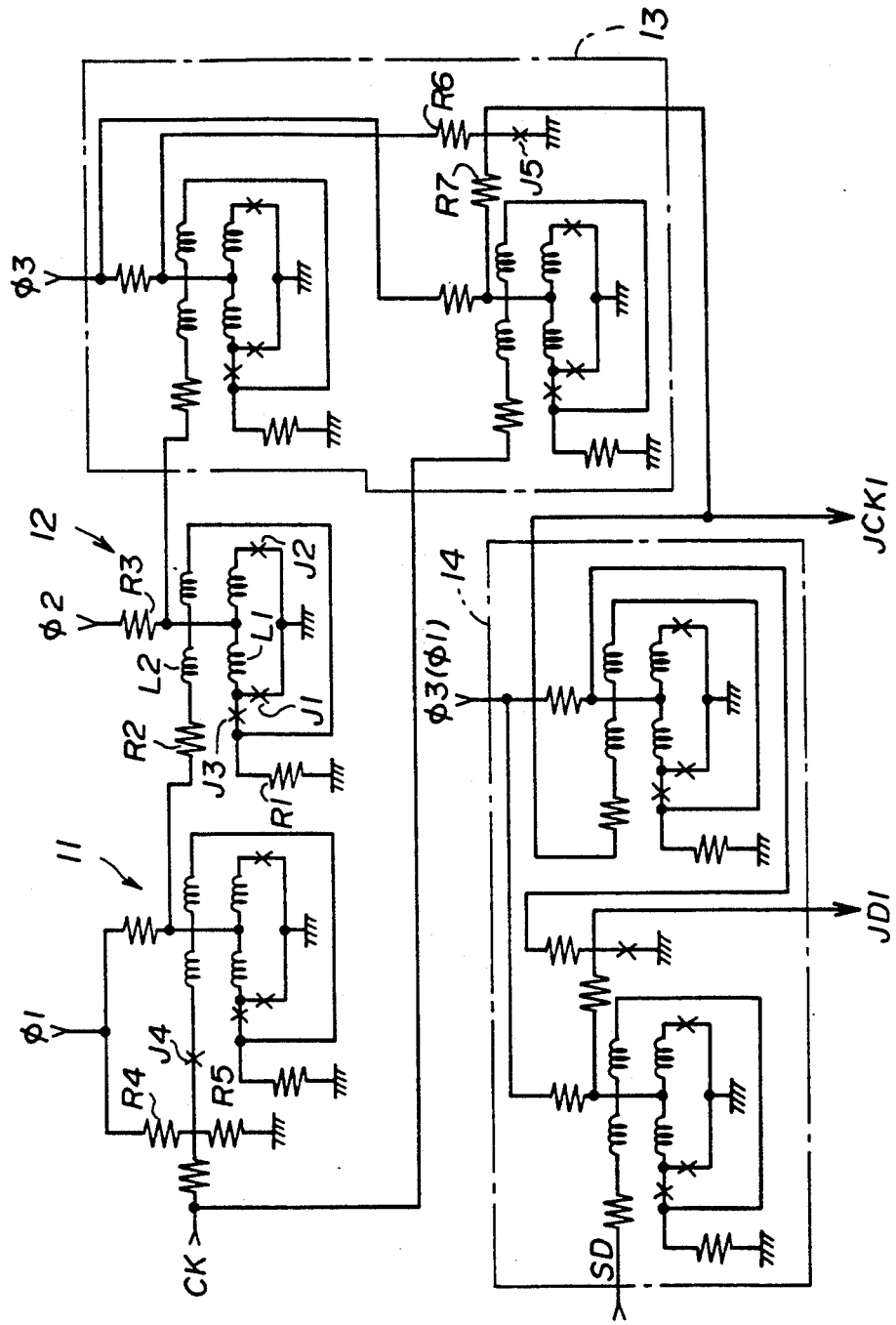
FIG. 2 is a circuit diagram of the interface circuit shown in FIG. 1.

FIG. 2 is a circuit diagram of the interface circuit 10 shown in FIG. 1. The non-inverting gate 12 is formed with a MVTL (Modified Variable Threshold Logic) gate including Josephson junctions J1, J2 and J3, inductances L1 and L2, and resistances R1, R2 and R3. The inverter 11 includes resistances R4 and R5 and a Josephson junction J4 in addition to the circuit configuration corresponding to the above-mentioned MVTL gate. The AND gate 13 includes resistances R6 and R7 and a Josephson junction J5, these elements being provided between two MVTL gates. The AND gate 14 has the same configuration as the AND gate 13. Each of the structural elements is itself known (see Japanese Laid-Open Patent Publication No. 59-190722).

When the alternating bias current applied to the inverter reaches 34% of its peak value, the inverter is turned ON, and holds the output signal corresponding to the inverted version of the input signal applied to the inverter at that time. The output signal held at the inverter is not affected by a change in the input signal. When the alternating bias current becomes equal to or less than 20% of its peak value, the inverter is turned OFF and the output signal of the inverter is thereby reset. The Josephson logic gates other than the inverter are turned ON when the corresponding alternating bias currents reach 50% of their peak values, and become responsive to the respective input signals. In this state, when the output signals of the above Josephson logic gates become "1", these gates hold the output signals. When the alternating bias currents become equal to or less than 20% of their peak values, the Josephson logic gates are turned OFF and the output signals thereof are thereby reset. In (1B), (2B) and (3B) of FIG. 3, the operation states of the Josephson logic gates respectively driven by the alternating bias currents $\phi 1$, $\phi 2$ and $\phi 3$ are illustrated. More particularly, high-level lines indicate that the Josephson logic gates are in the operating states, and low-level lines indicate that the Josephson logic gates are in the non-operating states. Further, hatched areas illustrated in (1B), (2B) and (3B) of FIG. 3 indicate concurrent operations of the Josephson logic gates, and signals are transferred between the cascaded Josephson gates.

A description will now be given of the operation of the interface circuit 10 shown in FIG. 1 with reference to FIG. 3. It will now be assumed that during period t1, the clock signal CK is at '0' (a low level) and the output signals of the inverter 11 and the non-inverting gate 12 are respectively '1' and that the output signals of the AND gates 13 and 14 are respectively '0'. It will further be assumed that the above state is represented as '01100', which indicates the input value of the inverter 11, the output value of the inverter 11, the output signal of the non-inverting gate 12, the output signal of the AND gate 13, and the output signal of the AND gate 14 arranged in this order.

In period t2, the clock signal CK rises in a state in which the inverter 11 is in the non-operating state and the AND gate 13 is in the operating state. In this state, the state of the interface circuit 10 is changed to '1111X' where X is the same as data SD. That is, the clock signal JCK1 rises in synchronism with the rise of the clock signal CK. When the data SD is equal to Ill during period t2, the data JD1 rises in synchronism with the rise of the clock signal CK.

In period t3, when the inverter 11 is switched to the operating state, the output signal thereof is inverted, and the state of the interface circuit 10 is changed to '1011X'.

In consecutive periods t4 and t5, the state of the interface circuit 10 is switched to '10000', and the clock signal JK1 falls when the non-inverting gate 12 is switched to the operating state in a state in which the inverter 11 is in the operating state ('0' is held in the inverter 11). Thereafter, while the clock signal CK is maintained at '1', the output signal of the non-inverting gate 12 is at '0', and the clock signal JCK1 is maintained at '0'.

It can be seen from the above that the inverter 11, the non-inverting gate 12 and the AND gate 13 function to detect switching of the clock signal CK (more particularly, each rising edge of the clock signal CK), and that the AND logic operation on the output signal of the AND gate 13 and the data SD is performed in response to the detection of each rise of the clock signal JCK1. In this manner, the Josephson circuit receives data JD1 corresponding to the data SD only once in response to a one-shot pulse of the clock signal CK.

When the alternating bias current $\phi 1$ is applied to the AND gate 14 in lieu of the alternating bias current $\phi 3$, the interface circuit 10 operates as shown by the broken lines shown in FIG. 3.

A description will now be given of an interface circuit 10A according to a second embodiment of the present invention, with reference to FIG. 4, in which parts that are the same as parts shown in the previously described figures are given the same reference numbers. In the configuration shown in FIG. 4, the positions of the inverter 11 and the non-inverting gate 12 shown in FIG. 1 are interchanged. More specifically, the clock signal CK from the semiconductor circuit is applied to the input terminal of the non-inverting gate 12, and the output terminal of the gate 12 is connected to the input terminal of the inverter 11. The output terminal of the inverter is connected to one of the two input terminals of the AND gate 13. Further, the alternating bias currents $\phi1$ and $\phi2$ are respectively applied to the power supply input terminals of the non-inverting gate 12 and the inverter 11. A clock signal JCK2 to be supplied to the Josephson junction element circuit is output from the AND gate 13, and data JD2 to be supplied thereto is output from the AND gate 14.

The operation of the interface circuit shown in FIG. 4 will now be described with reference to FIG. 3. It will be assumed that the alternating bias current $\phi3$ is applied to the power supply input terminal of the AND gate 14. In the period t1, the clock signal CK is at '0', and the output signals of the non-inverting gate 12 and the inverter 11 are respectively equal to '0' and '1'. Further, the output signals of the AND gates 13 and 14 are respectively '0'. The above state is represented as '00100' according to the aforementioned definition.

In the period t2, the clock signal CK rises in a state in which the non-inverting gate 12 is maintained in the non-operating state, and the AND gate 13 is maintained in the operating state. In response to the above rise of the clock signal CK, the state of the interface circuit 10A is changed to '1011X' where X is the same as data SD. That is, the clock signal JCK2 rises in response to the rise of the clock signal CK. At this time, if the data SD is equal to '1', the data JD2 rises in synchronism with the clock signal CK.

In the period t3, the non-inverting gate 12 is switched to the operating state, and the state of the interface circuit 10A is changed to '1111X'.

In the periods t4 and t5, the inverter 11 is changed to the operating state in a state in which the non-inverting gate 12 is in the operating state (the gate 12 holds the output '1'). Hence, the state of the interface circuit 10A is changed to '11000', and the clock signal JCK2 falls. After that, the output signal of the inverter 11 continues to be at '0' while the clock signal CK is at '1', and changes to '1' when the clock signal JCK2 rises the next time.

In this manner, the Josephson circuit receives data JD2 corresponding to the data SD only once in response to a one-shot pulse of the clock signal CK. The same operation as described above can also be performed when the alternating bias current $\phi1$ is applied to the power supply input terminal of the AND gate 14.

A description will now be given of an interface circuit 10B according to a third embodiment of the present invention with reference to FIG. 5, in which parts that are the same as parts shown in the previously described figures are given the same reference numbers. The interface circuit 10B employs two cascaded non-inverting gates 12A and 12B in lieu of the non-inverting gate 12 shown in FIG. 1. The alternating bias currents $\phi1$, $\phi2$ and $\phi3$ with respective offsets added thereto are respectively applied to power supply input terminals of the non-inverting gates 12A and 12B and the inverter 11. A clock signal JCK3 to be supplied to the Josephson junction element circuit is output from the AND gate 13, and data JD3 to be supplied thereto is output from the AND gate 14.

The operation of the interface circuit 10B will now be described with reference to FIG. 3. It will be assumed that the alternating bias current $\phi3$ is applied to the AND gate 14.

In the period t1, the clock signal CK is at '0', and the output signals of the non-inverting gates 12A and 12B and the inverter 11 are respectively equal to '0', '0' and '1'. Further, the output signals of the AND gates 13 and 14 are respectively equal to '0'. The above state of the interface circuit 10B is represented as '000100'.

In the period t2, the clock signal CK rises in a state in which the non-inverting gate 12A is in the non-operating state and the AND gate 13 is in the operating state, and the state of the interface circuit 10B is switched to '10011X' where X is the same as data SD. That is, the clock signal JCK3 rises in response to the rise of the clock CK. At this time, if the data SD is equal to '1', the data signal JD3 rises in synchronism with the clock signal CK.

In the period t3, the non-inverting gate 12A is switched to the operating state, and the state of the interface circuit 10B is changed to '11011X'.

In the period t4, when the non-inverting gate 12B is switched to the operating state in a state in which the non-inverting gate 12A is in the operating state, the state of the interface circuit 10B is changed to '111000'.

In the period t5, when the inverter 11 is switched to the operating state in a state in which the non-inverting gate 12B is in the operating state, the state of the interface circuit 10B is changed to '111000' and the clock signal JCK3 falls. Thereafter, the output signal of the inverter 11 is fixed at '0' while the clock signal CK is at '1'. The clock signal JCK3 changes to '1' when the clock signal CK rises the next time.

In this manner, the Josephson circuit receives data JD3 corresponding to the data SD only once in response to a one-shot pulse of the clock signal CK. The same operation as described above can also be performed when the alternating bias current $\phi1$ is applied to the power supply input terminal of the AND gate 14.

A description will now be given of an interface circuit 10C according to a fourth embodiment of the present invention with reference to FIG. 6, in which parts that are the same as parts shown in the previously described figures are given the same reference numbers.

The interface circuit 10C does not use the AND gate 14 shown in FIG. 1. The AND gate 13 shown in FIG. 6 directly receives data SD from the semiconductor element circuit. The data SD is a return-to-zero signal synchronized to the clock signal CK. That is, the data signal SD falls from the high level to the low level in synchronism with the fall of the clock signal CK. A clock signal JCK4 to be supplied to the Josephson junction element circuit is output from the non-inverting gate 12, and data JD4 to be supplied thereto is output from the AND gate 13.

The operation of the interface circuit 10C will now be described with reference to FIG. 3. In the period t1, the data SD and the clock signal CK are respectively at '0', and the output signals of the inverter 11 and the non-inverting gate 12 are respectively '1'. The above state of the interface circuit 10C is represented as '0110'.

In the period t2, the state of the interface circuit 10C is switched to '101X' when the clock signal CK rises in a state in which the inverter 11 is in the non-operating state and the non-inverting gate 12 is in the operating state.

In the period t3, the inverter 11 is switched to the operating state, and the non-inverting gate 12 is switched to the non-operating state. Hence, the state of the interface circuit 10C is changed to '101X'.

In the period t4, the state of the interface circuit 10C is changed to '1000' when the non-inverting gate 12 is changed to the operating state and the AND gate 13 is changed to the non-operating state in a state in which the inverter 11 is in the operating state.

In the period t5, the state of the interface circuit 10C is changed to '1000' when the AND gate 13 is switched to the operating state in a state in which the non-inverting gate 12 is in the operating state. Hence, the clock signal JCK4 falls. When the clock signal CK falls, the data signal SD simultaneously falls. Hence, the state of the interface circuit 10C is changed to '0110'.

In this manner, the Josephson circuit receives data JD4 corresponding to the data SD only once in response to a one-shot pulse of the clock signal CK.

A description will now be given of an interface circuit 10D according to a fifth embodiment of the present invention with reference to FIG. 7, in which parts that are the same as parts shown in the previously described figures are given the same reference numbers. In the configuration shown in FIG. 7, the positions of the inverter 11 and the non-inverting gate 12 shown in FIG. 6 are interchanged with each other. More particularly, the clock signal CK from the semiconductor element circuit is applied to the input terminal of the non-inverting gate 12, and the output terminal of the gate 12 is connected to the input terminal of the inverter 11. A clock signal JCK5 is output via the output terminal of the inverter 11. A data signal JD5 is output via the output terminal of the AND gate 13.

The operation of the interface circuit 10D shown in FIG. 7 will now be described with reference to FIG. 3.

In the period t1, the data SD and the clock signal CK are respectively '0', and the output signals of the non-inverting gate 12 and the inverter 11 are respectively equal to '0' and '1'. The above state of the interface circuit 10D is represented as '0010'.

In the period t2, the state of the interface circuit 10D is changed to '1010' when the clock signal CK rises in a state in which the non-inverting gate 12 is in the non-operating state and the inverter 11 is in the operating state.

In the period t3, the non-inverting gate 12 is switched to the operating state, and the state of the interface circuit 10D is changed to '111X' where X is the same as data SD.

In the period t4, the state of the interface circuit 10D is changed to '1100' when the inverter 11 is changed to the operating state in a state in which the non-inverting gate 12 is in the operating state.

In the period t5, the state of the interface circuit 10D is changed to '0010' when the AND gate 13 is switched to the operating state in a state in which the inverter 11 is in the operating state. Hence, the clock signal JCK4 falls. When the clock signal CK falls, the data signal SD simultaneously falls, and the state of the interface circuit 10D is changed to '0010'.

In this manner, the Josephson circuit receives data JD4 corresponding to the data SD only one time in response to a one-shot pulse of the clock signal CK.

A description will now be given of an interface circuit 10E according to a sixth embodiment of the present invention with reference to FIG. 8, in which parts that are the same as parts shown in the previously described figures are given the same reference numbers. The two cascaded non-inverting gates 12A and 12B shown in FIG. 5 are used in the configuration shown in FIG. 7 in lieu of the non-inverting gate 12 shown in FIG. 7. The alternating bias currents $\phi 1$, $\phi 2$ and $\phi 3$ with respective offsets added thereto are respectively applied to the power supply input terminals of the non-inverting gates 12A and 12B, and the inverter 11. A clock signal JCK6 to be supplied to the Josephson junction element circuit is output via the output terminal of the inverter 11, and a data signal JD6 to be supplied thereto is output via the output terminal of the AND gate 13.

The operation of the interface circuit 10E shown in FIG. 8 will now be described with reference to FIG. 3. In the period t1, the data SD and the clock signal CK are respectively at '0', and the output signals of the non-inverting gates 12A and 12B and the inverter 11 are respectively '0', '0' and '1'. The above state of the interface circuit 10E is represented as '00010'.

In the period t2, the state of the interface circuit 10E is changed to '1001X' when the clock signal CK rises in a state in which the non-inverting gate 12A is in the non-operating state and the non-inverting gate 12B is in the operating state.

In the period t3, the state of the interface circuit 10E is switched to '1101X' where X is the same as data SD, when the non-inverting gate 12A is changed to the operating state.

In the period t4, the state of the interface circuit 10E is switched to '11100' when the non-inverting gate 12B is switched to the operating state in a state in which the non-inverting gate 12A is in the operating state.

In the period t5, the state of the interface circuit 10E is changed to '11100' when the inverter 11 is switched to the operating state in a state in which the non-inverting gate 12B is in the operating state.

In this manner, the Josephson circuit receives data JD5 corresponding to the data SD only once in response to a one-shot pulse of the clock signal CK.

Figure 9:
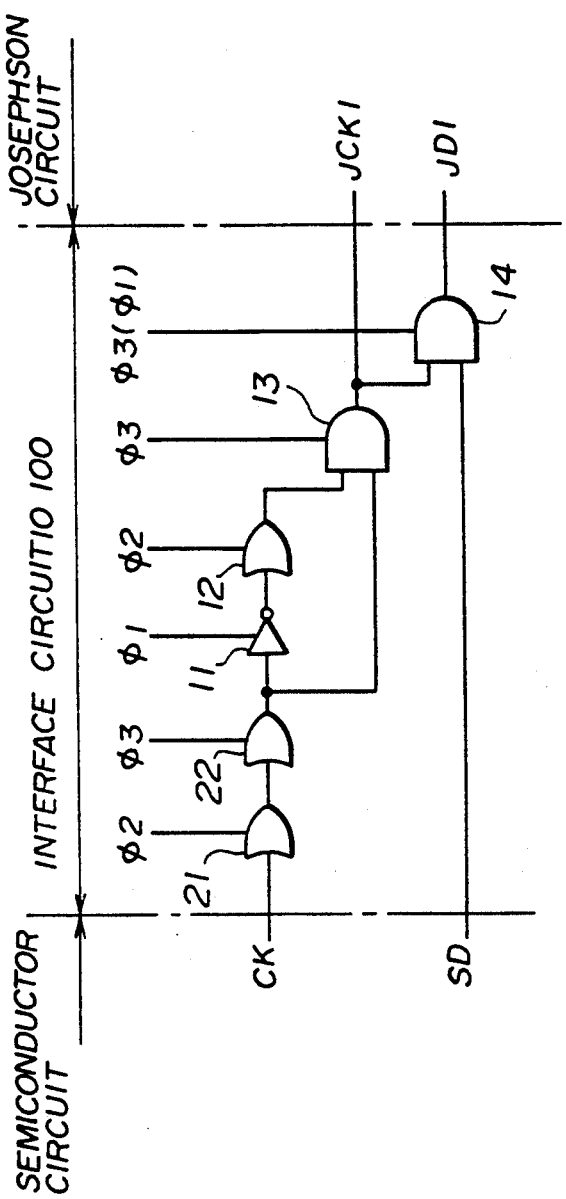
FIG. 9 is a block diagram of an interface circuit according to a modification of the first embodiment of the present invention.

A description will now be given, with reference to FIG. 9, of a modification 100 of the interface circuit 10 shown in FIG. 1. In FIG. 9, parts that are the same as parts shown in the previously described figures are given the same reference numbers. The clock signal CK from the semiconductor element circuit is applied to the input terminal of the inverter 11 via two cascaded non-inverting gates 21 and 22 driven by the alternating bias currents $\phi 2$ and $\phi 3$, respectively. One of the two input terminals of the AND gate 13 is connected to the output terminal of the non-inverting gate 22 and the input terminal of the inverter 11.

The clock signal CK applied to the non-inverting gate 21 is transferred to its output terminal when the non-inverting gate 21 is in the operating state (in other words, while the gate 21 is being biased by the alternating bias current $\phi 2$). The clock signal CK output via the output terminal of the non-inverting gate 21 is transferred via the non-inverting gate 22, the inverter 11, the non-inverting gate 12 and the AND gate 13 in synchronism with the alternating bias currents $\phi 3$, $\phi 1$, $\phi 2$ and $\phi 3$.

The output signal of the AND gate 13 is equal to '1' only when data transferred via the gates 21 and 22, the inverter 11 and the gate 12 is equal to '1' and data transferred via the gates 21, 22 and 13 is concurrently equal to '1'. That is, the output signal of the AND gate 13 becomes '1' only within the (n+1)th cycle in a case where the clock CK is equal to '0' within the nth cycle of the bias current $\phi 2$ from a time and the clock CK switches to Ill before the bias range of the (n+1)th cycle of the bias current $\phi 2$ and where the clock signal continues to be equal to '1'. Hence, the output signal of the AND gate 13 is equal to '1' within only the first bias range after the clock signal CK switches from '0' to '1'. The above holds true for a case where the clock signal CK switches from '0' to '1' within the bias range of the alternating bias current $\phi 2$. In this case, the output signal of the AND gate 13 is equal to '1' within only the first bias range of the bias current $\phi 3$ immediately after the bias range of the bias current $\phi 2$. Data JD1 is obtained by performing the AND operation on the output signal '1' of the AND gate 13 and the data SD. The Josephson circuit receives the data JD1 only once in response to a one-shot pulse of the clock signal CK.

The output signal of the inverter 11 is settled when the level of the alternating bias current $\phi 1$ increases to 34% of its peak value, and is maintained until the level of the alternating bias current $\phi 1$ decreases to a level equal to or less than about 20% of the peak value even if there is a change in the input signal of the inverter 11. The AND gate 13 executes the AND operation when the level of the alternating bias current $\phi 3$ is equal to or greater than 50% of the peak value of the current $\phi 3$. The operation result of the AND gate 13 is maintained until the level of the alternating bias current $\phi 3$ decreases to a level equal to or less than about 20% of the peak value.

Hence, when the input signal of the inverter 11 switches from '0' to '1' (the output of the inverter 11 is maintained at '1') immediately after the level of the alternating bias current $\phi 1$ increases to 34% of the peak value, the AND gate 13 executes the AND operation because the level of the alternating bias current $\phi 3$ is equal to or greater than 50%. With respect to data transferred via the inverter 11 and the non-inverting gate 12 in synchronism with the next cycles of the bias currents $\phi 1$ and $\phi 2$, the AND gate 13 outputs '1'. Hence, the Josephson circuit receives the same data twice. The above malfunction occurs within a period between the time when the level of the bias current cl reaches 34% of its peak value and the time when the level of the bias current $\phi 3$ becomes less than 50% of its peak value. The above period corresponds to 21% of one cycle of the bias current $\phi 1$ on the time base when the bias current $\phi 1$ is a sinusoidal wave. According to the interface circuit 100 shown in FIG. 9, the non-inverting gates 11 and 12 which are cascaded prevent the above-described malfunction.

Figure 10:
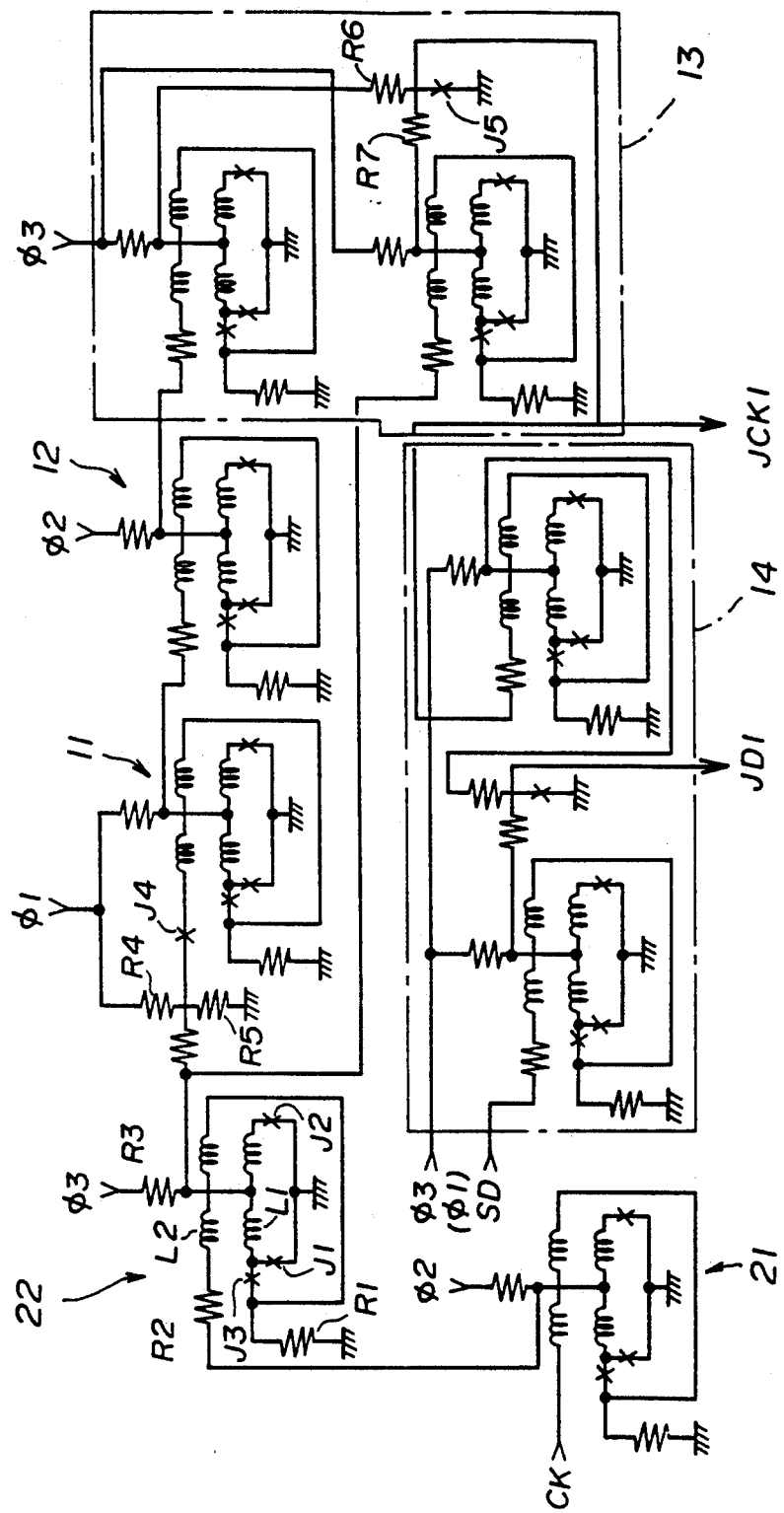
FIG. 10 is a circuit diagram of the interface circuit shown in FIG. 9.

FIG. 10 is a circuit diagram of the interface circuit 100 shown in FIG. 9. Each of the non-inverting gates 21 and 22 is configured identically to the aforementioned non-inverting gate 12.

The operation of the interface circuit 100 shown in FIG. 9 will be described with reference to FIG. 3. The alternating bias current $\phi 3$ is applied to the power supply input terminal of the AND gate 14. In period t1, the clock signal CK is at '0', and the output signals of the non-inverting gates 21 and 22 are respectively '0'. Further, the output signals of the inverter 11 and the non-inverting gate 12 are respectively equal to '1', and the output signals of the AND gates 13 and 14 are respectively equal to '0'. The above state of the interface circuit 100 is represented as '0001100'.

In the period t2, the state of the interface circuit 100 is switched to '111011X' where X is the same as data SD when the clock signal CK rises in a state in which the gates 21, 22, 12, 13 and 14 are in the operating states and the inverter 11 is in the non-operating state. Hence, the clock signal JCK1 rises.

In the period t3, the state of the interface circuit 100 is switched to '101001X' when the gates 21 and 12 are switched to the non-operating states and the inverter 11 is switched to the operating state in a state in which the gates 22, 13 and 13 are in the operating states.

In the period t4, the state of the interface circuit 100 is changed to '1100000' when the gates 22, 13 and 14 are switched to the non-operating states and the gates 21 and 12 are switched to the operating state in a state in which the inverter 11 is in the operating state.

In this manner, the Josephson circuit receives data JD1 corresponding to the data SD only once in response to a one-shot pulse of the clock signal CK. When the alternating bias current $\phi 1$ is applied to the AND gate 14 in lieu of the alternating bias current $\phi 3$, the interface circuit 10 operates as shown by the broken lines shown in FIG. 11.

Figure 4:
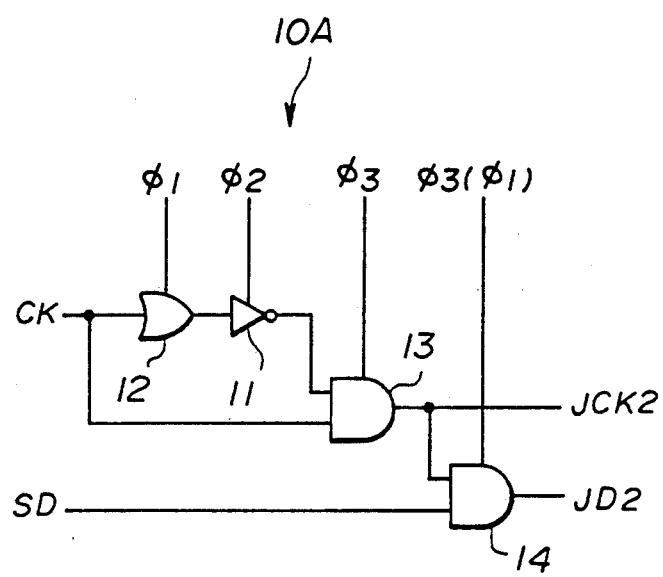
FIG. 4 is a block diagram of an interface circuit according to a second embodiment of the present invention.
Figure 12:
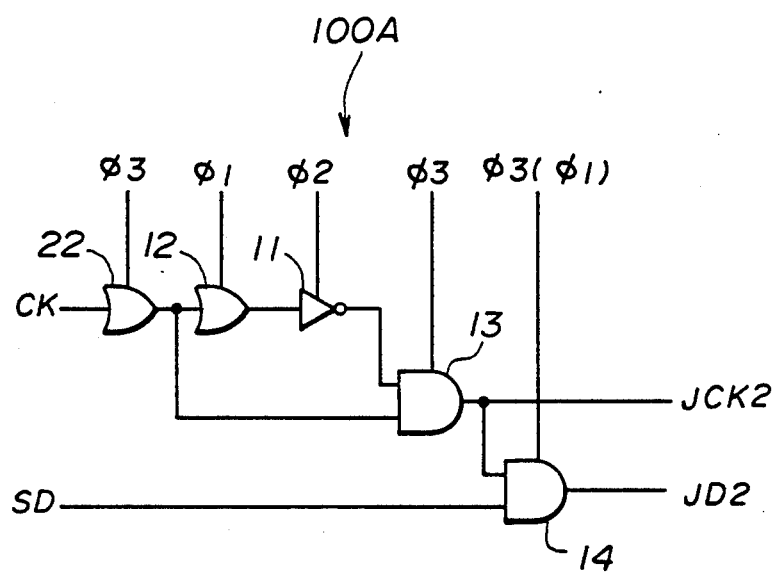
FIG. 12 is a block diagram of an interface circuit according to a modification of the second embodiment of the present invention.

FIG. 12 shows a modification 100A of the second embodiment of the present invention shown in FIG. 4. The non-inverting gate 22 shown in FIG. 9 is added to the interface circuit 10A shown in FIG. 4A. More particularly, the clock signal CK from the semiconductor element circuit is applied to the input terminal of the non-inverting gate 22. The output terminal of the gate 22 is connected to the input terminal of the non-inverting gate 12 and one of the two input terminals of the AND gate 13. The alternating bias current $\phi 3$ is applied to the power supply input terminal of the non-inverting gate 22.

Figure 11:
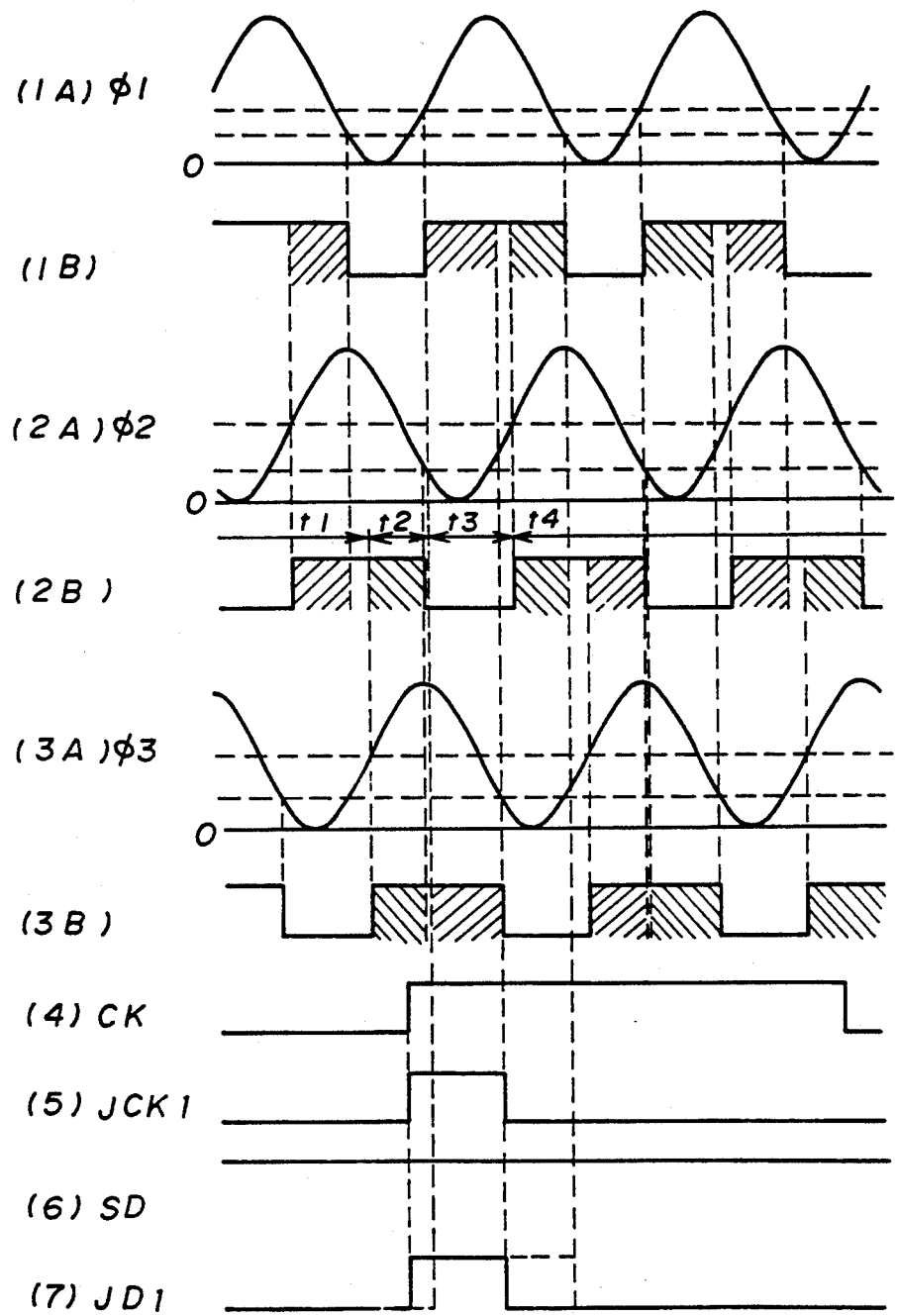
FIG. 11 is a waveform diagram illustrating the operation of the interface circuit shown in FIG. 9.

The operation of the interface circuit 100A will now be described with reference to FIG. 11. In the period t4, the clock signal CK is at '0', and the output signals of the non inverting gates 22 and 12 are respectively equal to '0'. Further, the output signal of the inverter 11 is at '1', and the output signals of the AND gates 13 and 14 are respectively equal to '0'. The above state of the interface circuit 100A is represented as '000100'.

In the period t2, the state of the interface circuit 100A is switched to '11011X' where X is the same as data SD, when the clock signal CK rises in a state in which the gate 22, the inverter 11 and the AND gates 13 and 14 are in the operating states, and the non-inverting gate 12 is in the non-operating state. Hence, the clock signal JCK2 rises.

In the period t3, the state of the interface circuit 100A is changed to '11101X' when the non-inverting gate 12 is switched to the non-operating state and the inverter 11 is switched to the operating state in a state in which the AND gates 13 and 14 are in the operating states.

In the period t4, the state of the interface circuit 100A is switched to '101000' and the clock signal JCK2 falls when the gates 22 and the gates 13 and 14 are switched to the non-operating states and the gate 12 is switched to the operating state in a state in which the inverter 11 is in the operating state. The output signal of the inverter 11 is fixed at '0' while the clock signal is at '1'. The clock signal JCK2 is maintained at '0' until the clock signal CK falls and rises the next time.

In this manner, the Josephson circuit receives data JD2 corresponding to the data SD only once in response to a one-shot pulse of the clock signal CK. The same operation as described above can also be performed when the alternating bias current $\phi 1$ is applied to the power supply input terminal of the AND gate 14.

Figure 5:
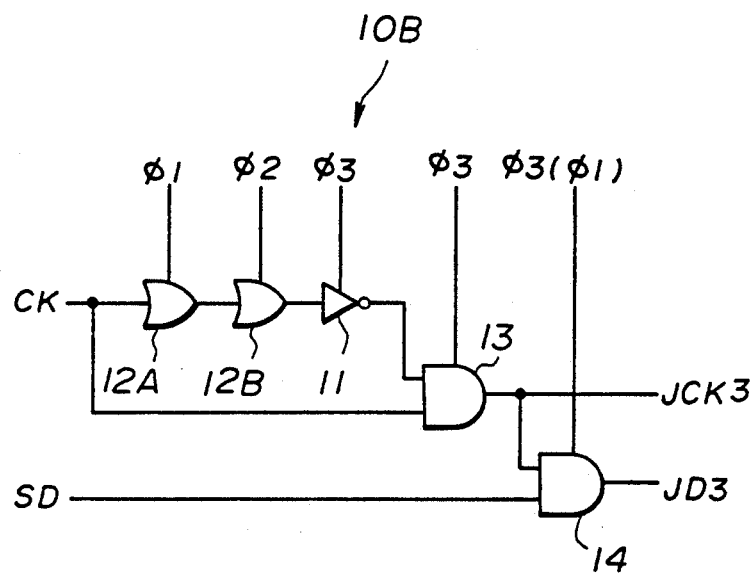
FIG. 5 is a block diagram of an interface circuit according to a third embodiment of the present invention.
Figure 13:
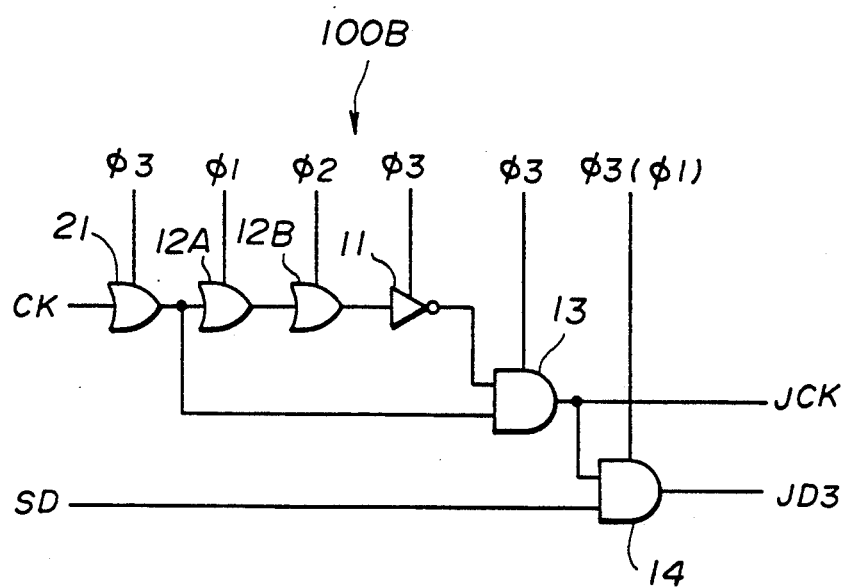
FIG. 13 is a block diagram of an interface circuit according to a modification of the third embodiment of the present invention.

FIG. 13 shows a modification 100B of the third embodiment of the present invention shown in FIG. 5. In FIG. 13, parts that are the same as parts shown in FIG. 5 are given the same reference numbers. The non-inverting gate 21 receiving the clock signal CK is connected to the output terminal of the non-inverting gate 12A.

In the period t1, the clock signal CK is at '0', and the output signals of the gates 21, 22 and 12, the inverter 11 and the AND gates 13 and 14 are at '0'. The above state of the interface circuit 100B is represented as '0000000'.

In the period t2, the state of the interface circuit 100B is switched to '110011X' where X is the same as SD and the clock signal JCK3 rises when the clock signal CK rises in a state in which the gates 21, 12, the inverter 11, and the AND gates 13 and 14 are in the operating states and the gate 12 is in the non-operating state.

In the period t3, the state of the interface circuit 100B is switched to '111011X' when the gate 12 is switched to the non-operating state and the gate 22 is switched to the operating state in a state in which the gate 21, the inverter 11 and the gates 13 and 14 are in the operating states.

In the period t4, the state of the interface circuit 100B is switched to '1011000' and the clock signal JCK3 falls when the gate 21, the inverter 11 and the gates 13 and 14 are switched to the non-operating states and the gate 12 is switched to the operating state. The output signal of the non-inverting gate 12 is maintained at '0' while the clock signal CK is at '1'. The clock signal JCK3 is fixed at '0' until the clock CK falls and then rises the next time.

In this manner, the Josephson circuit receives data JD3 corresponding to the data SD only once in response to a one-shot pulse of the clock signal CK. The same operation as described above can also be performed when the alternating bias current $\phi 1$ is applied to the power supply input terminal of the AND gate 14.

Figure 6:
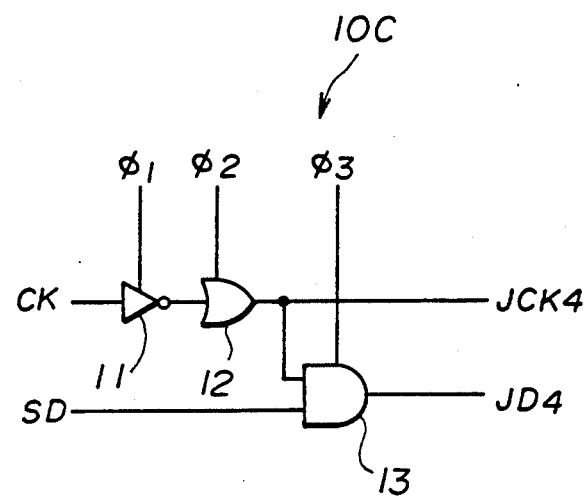
FIG. 6 is a block diagram of an interface circuit according to a fourth embodiment of the present invention.
Figure 14:
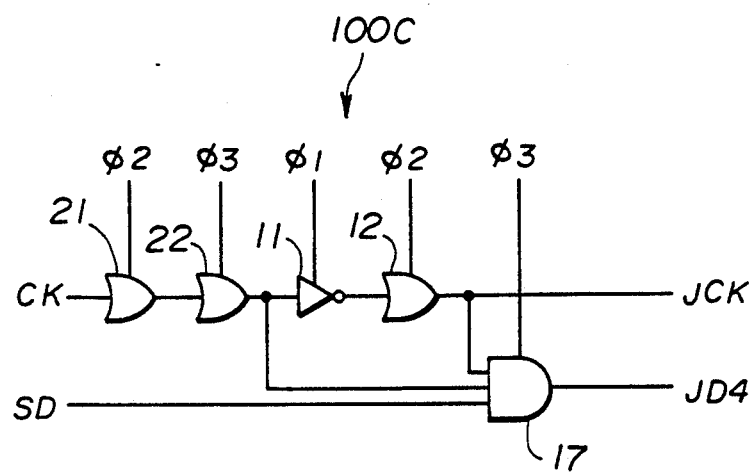
FIG. 14 is a block diagram of an interface circuit according to a modification of the fourth embodiment of the present invention.

FIG. 14 illustrates a modification 100C of the interface circuit 10C shown in FIG. 6. In FIG. 14, parts that are the same as parts shown in FIG. 6 are given the same reference numbers. The clock signal CK is applied to the input terminal of the inverter 11 via the two cascaded non-inverting gates 21 and 22. A three-input AND gate 17 driven by the alternating bias current $\phi 3$ is used in lieu of the AND gate 13 shown in FIG. 6. The AND gate 17 receives the clock signal JCK4, the data signal SD and the output signal of the non-inverting gate 22. The operation of the interface circuit 100C will be apparent from the description given previously.

Figure 7:
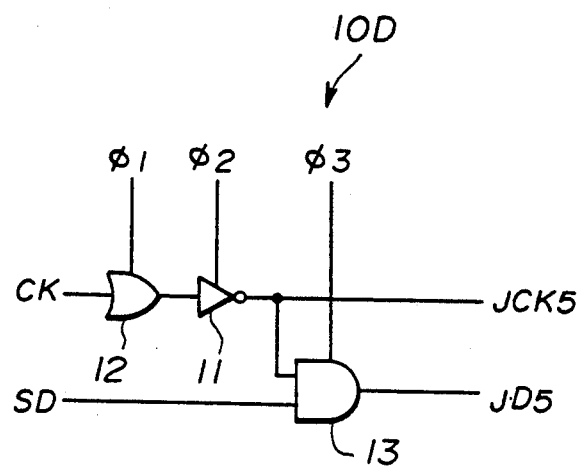
FIG. 7 is a block diagram of an interface circuit according to a fifth embodiment of the present invention.
Figure 15:
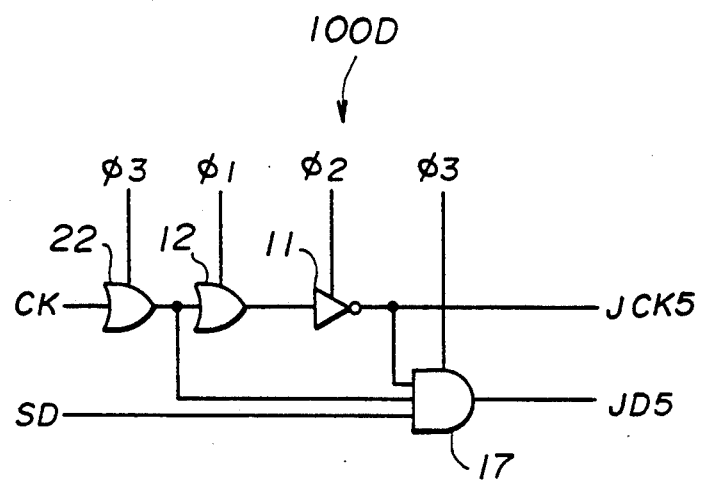
FIG. 15 is a block diagram of an interface circuit according to a modification of the fifth embodiment of the present invention.

FIG. 15 illustrates a modification 100D of the interface circuit 10D shown in FIG. 7. In the interface circuit 100D, the three-input AND gate 17 shown in FIG. 14 is used in lieu of the AND gate 13 shown in FIG. 7, and the non-inverting gate 22 driven by the alternating bias current $\phi 3$ is connected to the input terminal of the non-inverting gate 12. The operation of the interface circuit 100D will be apparent from the description given previously.

Figure 8:
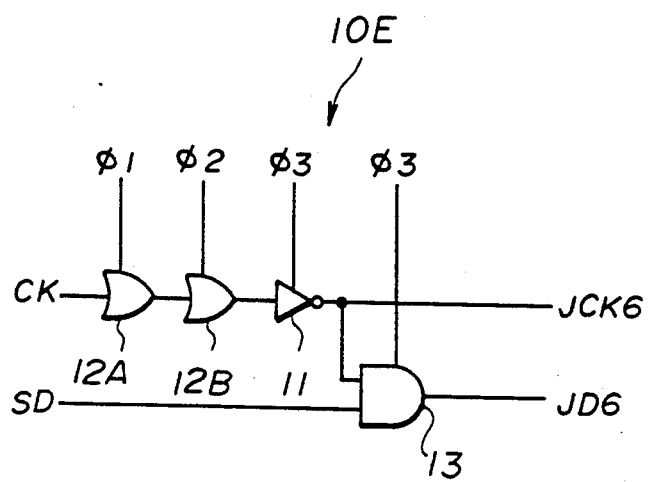
FIG. 8 is a block diagram of an interface circuit according to a sixth embodiment of the present invention.
Figure 16:
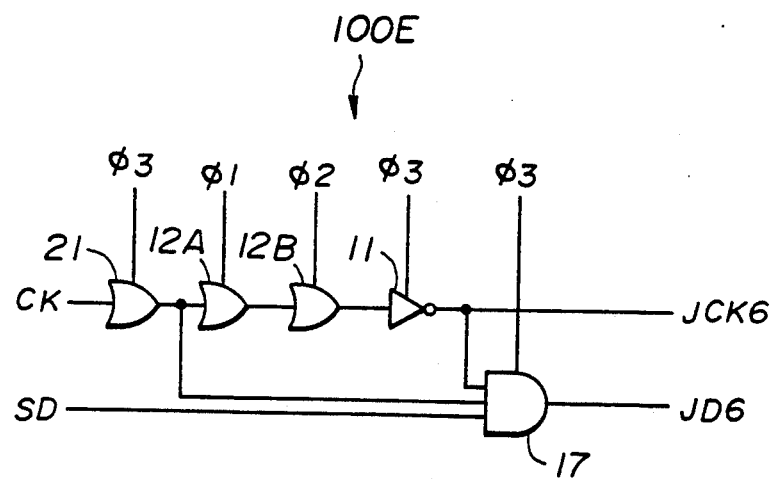
FIG. 16 is a block diagram of an interface circuit according to a modification of the sixth embodiment of the present invention.

FIG. 16 illustrates a modification 100E of the interface circuit 10E shown in FIG. 8. In the interface circuit 100E, the three-input AND gate 17 shown in FIG. 14 is used in lieu of the AND gate 13 shown in FIG. 8, and the non-inverting gate 22 driven by the alternating bias current $\phi 3$ is connected to the input terminal of the non-inverting gate 12A. The operation of the interface circuit 100E will be apparent from the description given previously.

The present invention is not limited to the specifically disclosed embodiments and modifications, and other variations and modifications may be made within the scope of the present invention. For example, the Josephson junction logic gates are not limited to MVTL gates and other types of Josephson gates can be used.

What is claimed is:

1. An interface circuit transferring a data signal from a semiconductor element circuit to a Josephson junction element circuit, said interface circuit comprising:

first means for detecting a of a change of a first clock signal supplied from the semiconductor element circuit and for generating a second clock signal in response to said change of a first clock signal;

second means, coupled to said first means, for performing an AND operation on the data signal and the second clock signal and for outputting a result of the AND operation to the Josephson junction element circuit as a second data signal; and timing adjustment means, coupled to said first means, for adjusting a timing at which the first clock signal is applied to said first means.

2. The interface circuit as claimed in claim 1, wherein said first means comprises:

an inverter which has an input terminal receiving the clock signal, and an output terminal and which is driven by a first alternating bias current;

a first non-inverting gate which has an input terminal coupled to the output terminal of said inverter, and an output terminal and which is driven by a second alternating bias current having a phase difference of 120° with respect to the first alternating bias current; and a first AND gate having a first input terminal coupled to the output terminal of said first non-inverting gate, a second input terminal receiving the first clock signal, and an output terminal, the first AND gate being driven by a third alternating bias current having a phase difference of 120° with respect to the second alternating bias current, the second clock signal being output via the output terminal of the first AND gate; and wherein said second means comprises a second AND gate having a first input terminal coupled to the output terminal of said first AND gate, a second input terminal receiving the first data signal, and an output terminal via which the second data signal is output to the Josephson junction element circuit, said second AND gate being driven by one of the first and third alternating bias currents.

3. The interface circuit as claimed in claim 1, wherein said first means comprises:

a first non-inverting gate which has an input terminal receiving the first clock signal, and an output signal and which is driven by a first alternating bias current signal;

an inverter having an input terminal connected to the output terminal of the first non-inverting gate, and an output terminal, the inverter being driven by a second alternating bias current having a phase difference of 120° with respect to the first alternating bias current; and a first AND gate having a first input terminal coupled to the output terminal of said inverter, a second input terminal receiving the first clock signal, and an output terminal, the first AND gate being driven by a third alternating bias current having a phase difference of 120° with respect to the second alternating bias current, the second clock signal being output via the output terminal of the first AND gate, and wherein said second means comprises a second AND gate having a first input terminal coupled to the output terminal of the first AND gate, a second input terminal receiving the first data signal, and an output terminal via which the second data signal is output to the Josephson junction element circuit, the second AND gate being driven by one of the first and third alternating bias currents.

4. The interface circuit as claimed in claim 1, wherein said first means comprises:
  a first non-inverting gate which has an input signal receiving the first clock signal, and an output terminal and which is driven by a first alternating bias current;
  a second non-inverting gate having an input terminal coupled to the output terminal of the first non-inverting gate, and an output terminal, said second non-inverting gate being driven by a second alternating bias current having a phase difference of 120° with respect to the first alternating bias current;
  an inverter having an input terminal coupled to the output terminal of the second non-inverting gate, and an output terminal, the inverter being driven by a third alternating bias current having a phase difference of 120° with respect to the second alternating bias current; and
  a first AND gate having a first input terminal coupled to the output terminal of the inverter, a second input terminal receiving the first clock signal, and an output terminal, said first AND gate being driven by the third alternating bias current, the second clock data signal being output via the output terminal of the first AND gate, and
  wherein said second means comprises a second AND gate having a first input terminal coupled to the output terminal of the first AND gate, a second input terminal receiving the first data signal, and an output terminal via which the second data signal being output to the Josephson junction element circuit,
  the second AND gate being driven by one of the first and third alternating bias currents.

5. The interface circuit as claimed in claim 1, wherein said first means comprises:
  an inverter having an input terminal receiving the first clock signal, and an output terminal and which is driven by a first alternating bias current; and
  a first non-inverting gate having an input terminal connected to the output terminal of the inverter, and an output terminal, the first non-inverting gate being driven by a second alternating bias current having a phase difference of 120° with respect to the first alternating bias current, the second clock signal being output via the output terminal of the first non-inverting gate, and
  wherein said second means comprises a second AND gate having a first input terminal receiving the second clock signal, a second input terminal receiving the first data signal, and an output terminal via which the second data signal is output to the Josephson junction element circuit,
  the second AND gate being driven by a third alternating bias current having a phase difference of 120° with respect to the second alternating bias current.

6. The interface circuit as claimed in claim 1, wherein said first means comprises:
  a first non-inverting gate which has an input terminal receiving the first clock signal, and an output terminal and which is driven by a first alternating bias current; and
  an inverter having an input terminal coupled to the output terminal of the first non-inverting gate, and output terminal, the inverter being driven by a second alternating bias current having a phase difference of 120° with respect to the first alternating bias current, said second clock signal being output via the output terminal of the inverter, and
  wherein said second means comprises a second AND gate having a first input terminal receiving the second clock signal, a second input terminal receiving the first data signal, and an output terminal via which the second data signal is output to the Josephson junction element circuit,
  said second AND gate being driven by a third alternating bias current having a phase difference of 120° with respect to the second alternating bias current.

7. The interface circuit as claimed in claim 1, wherein said first means comprises:
  a first non-inverting gate which has an input terminal receiving the first clock signal, and an output terminal and which is driven by a first alternating bias current;
  a second non-inverting gate having an input terminal coupled to the output terminal of the first non-inverting gate, and an output terminal, said second non-inverting gate being driven by a second alternating bias current having a phase difference of 120° with respect to the first alternating bias current; and
  an inverter having an input terminal coupled to the output terminal of said second non-inverting gate, and an output terminal via which said second clock signal is output, said inverter being driven by a third alternating bias current having a phase difference of 120° with respect to the second alternating bias current, and
  wherein said second means comprises a second AND gate having a first input terminal receiving the second clock signal, a second input terminal receiving the first data signal, and an output terminal via which the second data signal is output to the Josephson junction element circuit,
  the second AND gate being driven by the third alternating bias current.

8. The interface circuit as claimed in claim 2, further comprising:
  a second non-inverting gate which has an input terminal receiving the first clock signal, and an output terminal and which is driven by the second alternating bias current; and
  a third non-inverting gate having an input terminal connected to the output terminal of the second non-inverting gate, and an output terminal coupled to the input terminal of the inverter,
  the third non-inverting gate being driven by the third alternating bias current.

9. The interface circuit as claimed in claim 3, further comprising a second non-inverting gate having an input terminal receiving the first clock signal, and an output terminal coupled to the input terminal of the first non-inverting gate, the second non-inverting gate being driven by the third alternating bias current.

10. The interface circuit as claimed in claim 4, further comprising a third non-inverting gate having an input terminal receiving the first clock signal, and an output terminal coupled to the input terminal of the first non-inverting gate, the third non-inverting gate being driven by the third alternating bias current.

11. The interface circuit as claimed in claim 5, further comprising:

a second non-inverting gate having an input terminal receiving the first clock signal, and an output terminal, the second non-inverting gate being driven by the second alternating bias current; and a third non-inverting gate having an input terminal coupled to the second non-inverting gate, and an output terminal coupled to the input terminal of the inverter, said third non-inverting gate being driven by the third alternating bias current.

12. The interface circuit as claimed in claim 6, further comprising a second non-inverting gate having an input terminal receiving the first clock signal, and an output terminal coupled to the input terminal of the first non-inverting gate, the second non-inverting gate being driven by the third alternating bias current, and said first AND gate having a third input terminal coupled to the output terminal of the second non-inverting gate.

13. The interface circuit as claimed in claim 7, further comprising a third non-inverting gate having an input terminal receiving the first clock signal, and an output terminal coupled to the input terminal of the first non-inverting gate, the third non-inverting gate being driven by the third alternating bias current, and said first AND gate having a third input terminal coupled to the output terminal of the third non-inverting gate.

14. The interface circuit as claimed in claim 2, wherein the first, second and third alternating bias currents respectively have offset voltages.

15. The interface circuit as claimed in claim 3, wherein the first, second and third alternating bias currents respectively have offset voltages.

16. The interface circuit as claimed in claim 4, wherein the first, second and third alternating bias currents respectively have offset voltages.

17. The interface circuit as claimed in claim 5, wherein the first, second and third alternating bias currents respectively have offset voltages.

18. The interface circuit as claimed in claim 6, wherein the first, second and third alternating bias currents respectively have offset voltages.

19. The interface circuit as claimed in claim 7, wherein the first, second and third alternating bias currents respectively have offset voltages.

20. The interface circuit as claimed in claim 8, wherein the first, second and third alternating bias currents respectively have offset voltages.

21. The interface circuit as claimed in claim 1, wherein said first means comprises means for detecting a rise of the first clock signal.

22. The interface circuit as claimed in claim 1, wherein the second clock signal has a pulse width shorter than that of the first clock signal.

23. The interface circuit as claimed in claim 1, wherein the second data signal has a pulse width for a data value shorter than that of the first data signal.

* * * * *